(12) United States Patent
Mitsuya (10) Patent No.: US 9,201,126 B2
(45) Date of Patent: Dec. 1, 2015

(54) CURRENT SENSOR

(71) Applicant: ALPS GREEN DEVICES CO., LTD., Tokyo (JP)

(72) Inventor: Shinji Mitsuya, Miyagi-ken (JP)

(73) Assignee: ALPS GREEN DEVICES CO., LTD., Tokyo (JP)

( * ) Notice: Subject to any disclaimer, the term of this patent is extended or adjusted under 35 U.S.C. 154(b) by 64 days.

(21) Appl. No.: 14/278,536

(22) Filed: May 15, 2014

(65) Prior Publication Data

US 2014/0247044 A1 Sep. 4, 2014

Related U.S. Application Data

(63) Continuation of application No. PCT/JP2012/080758, filed on Nov. 28, 2012.

(30) Foreign Application Priority Data

Dec. 28, 2011 (JP) ................................. 2011-287536

(51) Int. Cl.
| | |
|---|---|
| *G01R 33/02* | (2006.01) |
| *G01R 33/09* | (2006.01) |
| *G01R 15/20* | (2006.01) |
| *G01R 19/00* | (2006.01) |
| *H01L 43/08* | (2006.01) |

(52) U.S. Cl.
CPC ............ *G01R 33/093* (2013.01); *G01R 15/205* (2013.01); *G01R 19/0046* (2013.01); *G01R 33/09* (2013.01); *H01L 43/08* (2013.01); *H01L 2924/30107* (2013.01)

(58) Field of Classification Search
CPC .................. G01R 33/093; H01L 43/08; H01L 2924/30107
USPC .................................................. 324/252, 244
See application file for complete search history.

(56) References Cited

U.S. PATENT DOCUMENTS

| | | | |
|---|---|---|---|
| 5,933,003 A | 8/1999 | Hebing et al. | |
| 7,394,240 B2 | 7/2008 | Shoji | |
| 9,063,185 B2 * | 6/2015 | Hebiguchi | |
| 2005/0185346 A1 | 8/2005 | Shoji | |
| 2013/0307534 A1* | 11/2013 | Hebiguchi et al. | ............ 324/252 |

FOREIGN PATENT DOCUMENTS

JP 2006-66821 3/2006

OTHER PUBLICATIONS

Search Report dated Mar. 5, 2013 from International Application No. PCT/JP2012/080758.

* cited by examiner

*Primary Examiner* — Reena Aurora (74) *Attorney, Agent, or Firm* — Beyer Law Group LLP (57) ABSTRACT

A current sensor includes a first magnetic sensor and a second magnetic sensor which are configured to detect an induced magnetic field from target current to be measured flowing through a current line. The first and second magnetic sensors each include a magnetoresistive element that includes a free magnetic layer and a hard bias layer applying a bias magnetic field to the free magnetic layer. The bias magnetic field in the magnetoresistive element of the first magnetic sensor is oriented opposite to the bias magnetic field in the magnetoresistive element of the second magnetic sensor.

4 Claims, 10 Drawing Sheets

CURRENT SENSOR

CLAIM OF PRIORITY

This application is a Continuation of International Application No. PCT/JP2012/080758 filed on Nov. 28, 2012, which claims benefit of Japanese Patent Application No. 2011-287536 filed on Dec. 28, 2011. The entire contents of each application noted above are hereby incorporated by reference.

BACKGROUND OF THE INVENTION

1. Field of the Invention

The present invention relates to a current sensor capable of measuring target current in a contactless manner.

2. Description of the Related Art

In the fields of electric-powered vehicles and solar batteries, there has been known a current sensor for detecting an induced magnetic field, resulting from target current to be measured, using a giant magnetoresistive (GMR) element, serving as a magnetic detecting element (refer to U.S. Pat. No. 7,394,240, for example). The current sensor disclosed in U.S. Pat. No. 7,394,240 detects target current on the basis of the difference between outputs of a plurality of GMR elements, thus achieving high sensitivity.

The GMR element fundamentally includes an antiferromagnetic layer, a fixed magnetic layer, a nonmagnetic layer, and a free magnetic layer. The fixed magnetic layer is disposed on the antiferromagnetic layer and the direction of magnetization of the fixed magnetic layer is fixed in a given direction by an exchange-coupled magnetic field generated between the fixed magnetic layer and the antiferromagnetic layer. The free magnetic layer is disposed on the fixed magnetic layer with the nonmagnetic layer (nonmagnetic interlayer) therebetween. The magnetization direction of the free magnetic layer changes depending on an external magnetic field. The GMR element is configured such that its electrical resistance varies depending on the relationship between the magnetization direction of the free magnetic layer depending on the external magnetic field applied and the magnetization direction of the fixed magnetic layer. Thus, the external magnetic field can be detected.

To increase the linearity of the relationship between the electrical resistance and the intensity of the external magnetic field, such a GMR element may include a hard bias layer to apply a bias magnetic field to the free magnetic layer. Consequently, the magnetization of the free magnetic layer is aligned in a given direction, thus increasing sensitivity to detect the external magnetic field. A current sensor with higher detection sensitivity can be achieved using such a GMR element (refer to Japanese Unexamined Patent Application Publication No. 2006-66821, for example).

For the above-described GMR element including the hard bias layer to apply the bias magnetic field, the direction of magnetization of the free magnetic layer in the GMR element is aligned by the bias magnetic field. If an external magnetic field is applied in a direction parallel to the bias magnetic field (or perpendicular to a sensing direction of the GMR element), the detection sensitivity would change. In a current sensor including this GMR element, the accuracy of current measurement may decrease due to the presence of an external magnetic field oriented in the direction parallel to the bias magnetic field.

SUMMARY OF THE INVENTION

The present invention has been made in consideration of the above-described disadvantage. The present invention provides a current sensor capable of suppressing a reduction in accuracy of current measurement if an external magnetic field is applied in a direction parallel to a bias magnetic field.

The present invention provides a current sensor including first to fourth magnetoresistive elements configured to detect an induced magnetic field from target current to be measured flowing through a current path, and an arithmetic unit configured to perform arithmetic processing on outputs of the first to fourth magnetoresistive elements. The first to fourth magnetoresistive elements each include a free magnetic layer and a hard bias layer applying a bias magnetic field to the free magnetic layer. The first to fourth magnetoresistive elements are arranged such that the bias magnetic field in the first magnetoresistive element is oriented opposite to the bias magnetic field in the second magnetoresistive element, the bias magnetic field in the third magnetoresistive element is oriented opposite to the bias magnetic field in the fourth magnetoresistive element, the bias magnetic field in the first magnetoresistive element is oriented in the same direction as the bias magnetic field in the third magnetoresistive element, and the bias magnetic field in the second magnetoresistive element is oriented in the same direction as the bias magnetic field in the fourth magnetoresistive element. The first to fourth magnetoresistive elements are arranged such that the induced magnetic field from the target current is applied to the first and second magnetoresistive elements in the same direction, the induced magnetic field from the target current is applied to the third and fourth magnetoresistive elements in the same direction, and the induced magnetic field applied from the target current to the first and second magnetoresistive elements is oriented opposite to the induced magnetic field applied from the target current to the third and fourth magnetoresistive elements. The first to fourth magnetoresistive elements are arranged such that a sensing axis of the first magnetoresistive element is oriented in the same direction as a sensing axis of the third magnetoresistive element, a sensing axis of the second magnetoresistive element is oriented in the same direction as a sensing axis of the fourth magnetoresistive element, and the sensing axes of the first to fourth magnetoresistive elements are parallel to one another. The first to fourth magnetoresistive elements are arranged such that the sensing axes of the first to fourth magnetoresistive elements are oriented in the same direction. The arithmetic unit subtracts a second output sum that is the sum of an output of the third magnetoresistive element and an output of the fourth magnetoresistive elements from a first output sum that is the sum of an output of the first magnetoresistive element and an output of the second magnetoresistive element.

In the current sensor, the current path may be linear. The first and second magnetoresistive elements may be arranged adjacent to a first surface of the current path. The third and fourth magnetoresistive elements may be arranged adjacent to a second surface of the current path opposite the first surface.

The present invention further provides a current sensor including first to fourth magnetoresistive elements configured to detect an induced magnetic field from target current to be measured flowing through a current path, and an arithmetic unit configured to perform arithmetic processing on outputs of the first to fourth magnetoresistive elements. The first to fourth magnetoresistive elements each include a free magnetic layer and a hard bias layer applying a bias magnetic field to the free magnetic layer. The first to fourth magnetoresistive elements are arranged such that the bias magnetic field in the first magnetoresistive element is oriented opposite to the bias magnetic field in the second magnetoresistive element, the bias magnetic field in the third magnetoresistive element is oriented opposite to the bias magnetic field in the fourth magnetoresistive element, the bias magnetic field in the first magnetoresistive element is oriented in the same direction as the bias magnetic field in the third magnetoresistive element, and the bias magnetic field in the second magnetoresistive element is oriented in the same direction as the bias magnetic field in the fourth magnetoresistive element. The first to fourth magnetoresistive elements are arranged such that the induced magnetic field from the target current is applied to the first and second magnetoresistive elements in the same direction, the induced magnetic field from the target current is applied to the third and fourth magnetoresistive elements in the same direction, and the induced magnetic field applied from the target current to the first and second magnetoresistive elements is oriented opposite to the induced magnetic field applied from the target current to the third and fourth magnetoresistive elements. The first to fourth magnetoresistive elements are arranged such that a sensing axis of the first magnetoresistive element is oriented in the same direction as a sensing axis of the third magnetoresistive element, a sensing axis of the second magnetoresistive element is oriented in the same direction as a sensing axis of the fourth magnetoresistive element, and the sensing axes of the first to fourth magnetoresistive elements are parallel to one another. The first to fourth magnetoresistive elements are arranged such that the sensing axes of the first and third magnetoresistive elements are oriented opposite to the sensing axes of the second and fourth magnetoresistive elements. The arithmetic unit subtracts a second output difference that is the difference between an output of the third magnetoresistive element and an output of the fourth magnetoresistive element from a first output difference that is the difference between an output of the first magnetoresistive element and an output of the second magnetoresistive element.

In the current sensor, the current path may include a first portion and a second portion parallel to each other and a third portion perpendicular to the first and second portions, the third portion connecting the first and second portions. The first to fourth magnetoresistive elements may be arranged adjacent to one surface of the current path such that the first and second magnetoresistive elements are arranged so as to detect the induced magnetic field from the target current flowing through the first portion and the third and fourth magnetoresistive elements are arranged so as to detect the induced magnetic field from the target current flowing through the second portion.

In the configuration of each of the above-described current sensors, the bias magnetic field in the first magnetoresistive element is oriented opposite to that in the second magnetoresistive element and the bias magnetic field in the third magnetoresistive element is oriented opposite to that in the fourth magnetoresistive element. Accordingly, if an external magnetic field is applied in a direction parallel to the bias magnetic fields, changes in sensitivity of the magnetoresistive elements can be canceled out. Furthermore, if an external magnetic field is applied in the direction along the sensing axes, the influence of the external magnetic field can be canceled out. Thus, a reduction in accuracy of current measurement caused by the external magnetic fields can be suppressed.

DESCRIPTION OF THE PREFERRED EMBODIMENTS

The inventor has found that the detection sensitivity of a magnetoresistive element that includes a hard bias layer to apply a bias magnetic field changes when an external magnetic field is applied in a direction parallel to the bias magnetic field. This change results from aligning the direction of magnetization of a free magnetic layer in this magnetoresistive element by the bias magnetic field. When the external magnetic field is applied in the direction parallel to the bias magnetic field, the magnetization of the free magnetic layer changes. Consequently, the detection sensitivity of the magnetoresistive element also changes.

The inventor has found on the basis of the above-described finding that controlling arrangement of magnetoresistive elements in consideration of the relationship between the arrangement and the bias magnetic fields applied by the hard bias layers can reduce the influence of a change in sensitivity of a current sensor. Specifically, the essence of the present invention is that a current sensor including a plurality of magnetoresistive elements is configured such that bias magnetic fields in two corresponding magnetoresistive elements are oriented opposite to each other. The current sensor according to the present invention will be described below with reference to the accompanying drawings.

First Embodiment

Figure 1:
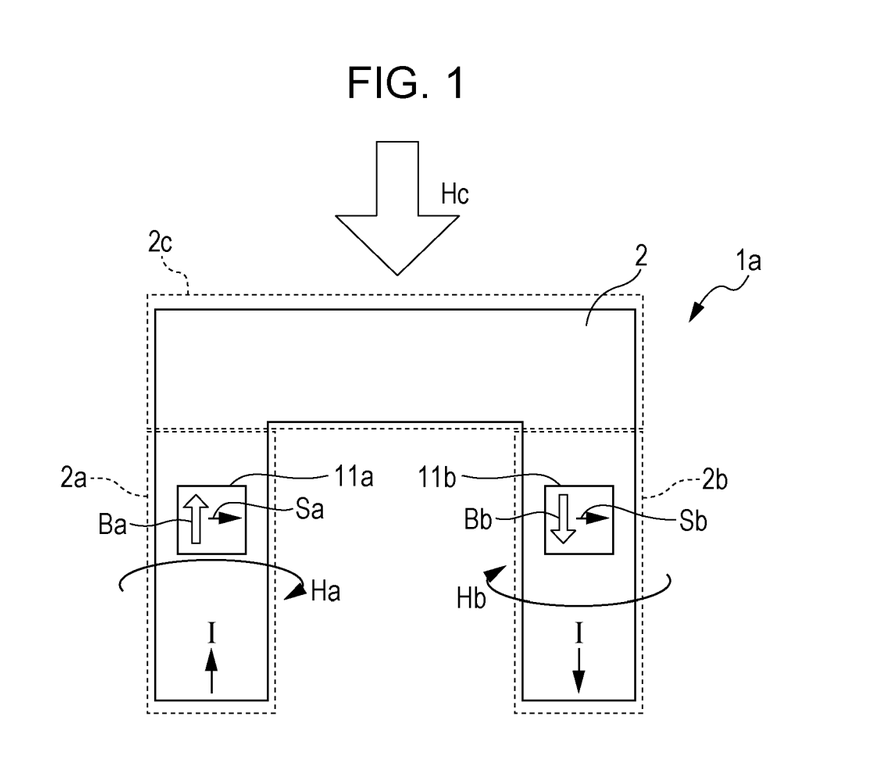
FIG. 1 is a schematic plan view of an exemplary arrangement of a current sensor according to a first embodiment and its surroundings.
Figure 2:
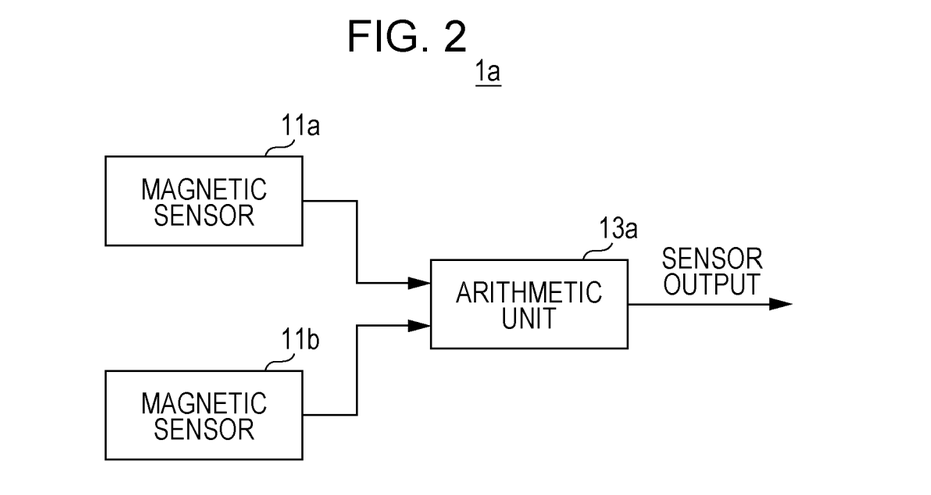
FIG. 2 is a block diagram illustrating a circuit configuration of the current sensor according to the first embodiment.

FIG. 1 is a schematic plan view of an exemplary arrangement of a current sensor according to a first embodiment of the present invention and its surroundings. FIG. 2 is a block diagram illustrating a circuit configuration of the current sensor according to the first embodiment. As illustrated in FIGS. 1 and 2, the current sensor, indicated at 1a, includes substantially rectangular-parallelepiped magnetic sensors 11a and 11b arranged in close proximity to a current line 2 through which target current I flows and an arithmetic unit 13a to perform arithmetic processing on outputs of the magnetic sensors 11a and 11b.

Referring to FIG. 1, the magnetic sensors 11a and 11b of the current sensor 1a are arranged in close proximity to the current line 2 so that the magnetic sensors 11a and 11b can measure the target current I flowing through the current line 2. The current line 2 includes two arms 2a and 2b extending substantially parallel to each other and a connecting portion 2c extending substantially perpendicular to the arms 2a and 2b. The connecting portion 2c connects one end of the arm 2a and that of the arm 2b. In other words, the current line 2 is substantially U-shaped in plan view. The arms 2a and 2b and the connecting portion 2c of the current line 2 may be separate parts.

The magnetic sensor 11a is disposed in close proximity to the arm 2a of the current line 2 and is capable of detecting an induced magnetic field Ha from the target current I flowing through the arm 2a. The current sensor 11b is disposed in close proximity to the arm 2b of the current line 2 and is capable of detecting an induced magnetic field Hb from the target current I flowing through the arm 2b. The magnetic sensors 11a and 11b are arranged on a substrate (not illustrated).

The magnetic sensor 11a is disposed such that a sensing direction Sa (along a sensing axis) of the magnetic sensor 11a is rightward in FIG. 1. In FIG. 1, the target current I flows through the arm 2a of the current line 2 so as to generate the induced magnetic field Ha oriented to the right in FIG. 1 in the vicinity of the magnetic sensor 11a. In other words, the sensing direction Sa of the magnetic sensor 11a is the same as (or forward relative to) the direction of the induced magnetic field Ha in the current sensor 1a of FIG. 1.

The magnetic sensor 11b is disposed such that a sensing direction Sb (along a sensing axis) of the magnetic sensor 11b is rightward in FIG. 1. In FIG. 1, the target current I flows through the arm 2b of the current line 2 so as to generate the induced magnetic field Hb oriented to the left in FIG. 1 in the vicinity of the magnetic sensor 11b. In other words, the sensing direction Sb of the magnetic sensor 11b is opposite to (or backward relative to) the direction of the induced magnetic field Hb in the current sensor 1a of FIG. 1.

As described above, the magnetic sensors 11a and 11b are arranged such that the direction of the induced magnetic field Ha applied to the magnetic sensor 11a with reference to the sensing direction Sa is opposite to the direction of the induced magnetic field Hb applied to the magnetic sensor 11b with reference to the sensing direction Sb. Specifically, the induced magnetic field in the forward direction is applied to one of the magnetic sensors and the induced magnetic field in the backward direction is applied to the other one of the magnetic sensors. Consequently, the two magnetic sensors are affected by the target current I in an opposite manner and thus output signals of substantially opposite polarities. So long as the induced magnetic field in the forward direction is applied to one of the magnetic sensors and the induced magnetic field in the backward direction is applied to the other one of the magnetic sensors, the arrangement of the components is not limited to that illustrated in FIG. 1. For example, the target current I may flow through the current line 2 in a direction opposite to that in FIG. 1.

The magnetic sensors 11a and 11b each include a magnetoresistive element that includes a hard bias layer, which will be described later. The magnetic sensor 11a is disposed such that a bias magnetic field Ba from the hard bias layer in the magnetoresistive element is oriented upward in FIG. 1. The magnetic sensor 11b is disposed such that a bias magnetic field Bb from the hard bias layer in the magnetoresistive element is oriented downward in FIG. 1. In other words, the current sensor 1a is configured such that the bias magnetic field Ba in the magnetoresistive element included in the magnetic sensor 11a is oriented opposite to (or backward relative to) the bias magnetic field Bb in the magnetoresistive element included in the magnetic sensor 11b.

Consequently, when an external magnetic field having a component parallel to the bias magnetic fields is applied to the magnetic sensors, the applied external magnetic field affects one of the magnetic sensors such that the sensitivity of the magnetic sensor increases and affects the other one of the magnetic sensors such that the sensitivity of the magnetic sensor decreases. For example, when an external magnetic field Hc is applied to the magnetic sensors 11a and 11b as illustrated in FIG. 1, the applied external magnetic field Hc affects the magnetic sensor 11a such that the sensitivity of the magnetic sensor 11a increases and affects the magnetic sensor 11b such that the sensitivity of the magnetic sensor 11b decreases. The directions of the bias magnetic fields in the magnetic sensors 11a and 11b are not limited to those illustrated in FIG. 1 so long as one of the bias magnetic fields is oriented opposite to (or backward relative to) the other bias magnetic field.

Figure 3:
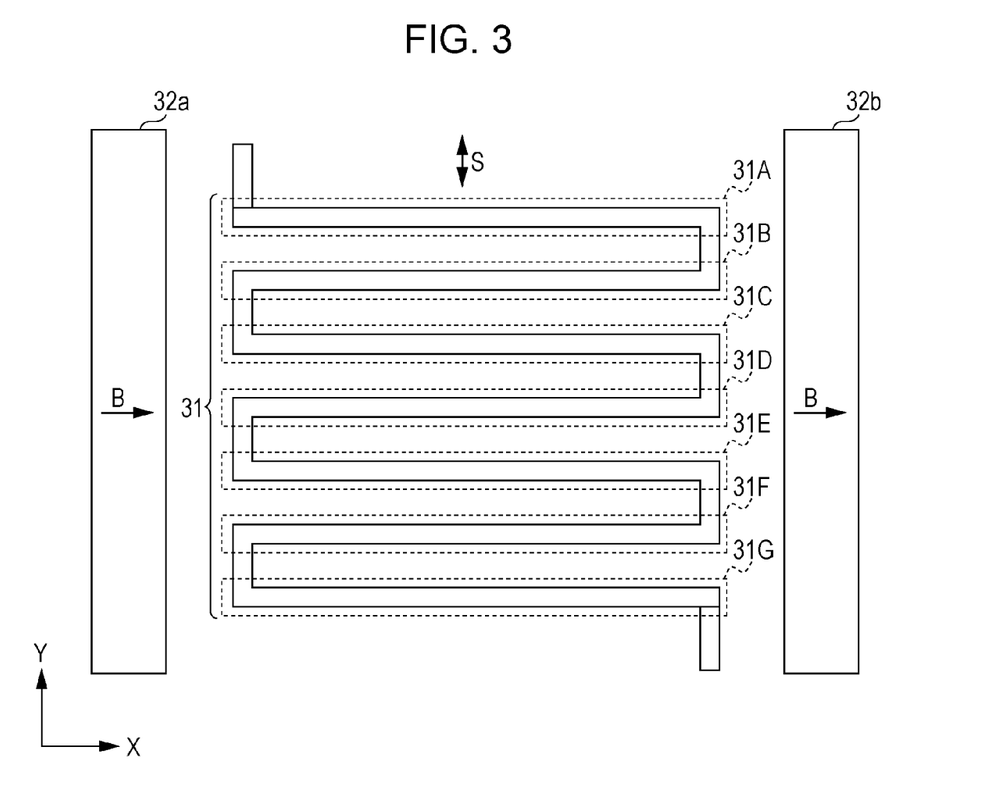
FIG. 3 is a schematic plan view of an exemplary configuration of each magnetoresistive element.

FIG. 3 is a schematic plan view of an exemplary configuration of the magnetoresistive element (GMR element) included in each of the magnetic sensors 11a and 11b. The magnetoresistive element of FIG. 3 includes a magnetic detection pattern 31 including a plurality of elongated parts 31A to 31G arranged in a direction (Y direction) orthogonal to a longitudinal direction (X direction) along the length of the elongated parts 31A to 31G The elongated parts 31A to 31G are arranged substantially parallel to one another. An end of each elongated parts is connected to an end of the next elongated parts. Consequently, the magnetic detection pattern 31 is meandering-shaped. In FIG. 3, the sensing direction S (along the sensing axis) of the element is the direction (Y direction) orthogonal to the longitudinal direction of the elongated parts 31A to 31G Although FIG. 3 illustrates the magnetic detection pattern 31 including seven elongated parts 31A to 31G, the magnetic detection pattern 31 may include any number of elongated parts.

Hard bias layer segments 32a and 32b extending in the direction (Y direction) orthogonal to the longitudinal direction of the elongated parts are arranged apart from both ends of the magnetic detection pattern 31. The hard bias layer segments 32a and 32b are configured to apply the bias magnetic field B oriented parallel to the longitudinal direction of the elongated parts 31A to 31G to the free magnetic layer included in the magnetic detection pattern 31.

Figure 4:
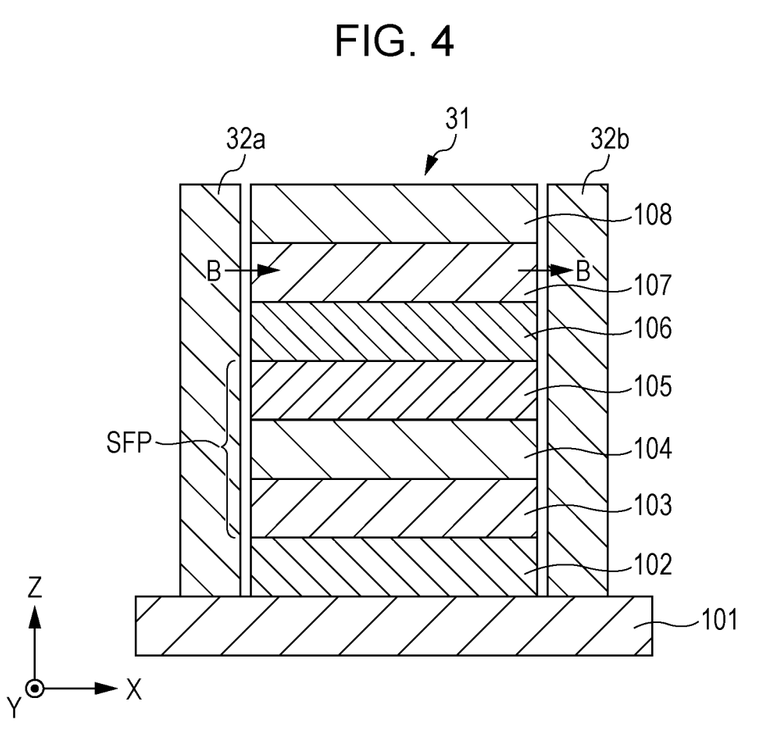
FIG. 4 is a schematic cross-sectional view of the exemplary configuration of the magnetoresistive element.

FIG. 4 is a schematic cross-sectional view of the exemplary configuration of the magnetoresistive element (GMR element). As illustrated in FIG. 4, the magnetoresistive element included in the current sensor according to the first embodiment has a laminated structure disposed on a substrate 101. Specifically, the magnetoresistive element includes a laminated structure constituting the magnetic detection pattern 31 and the hard bias layer segments 32a and 32b. The magnetic detection pattern 31 includes a seed layer 102, a first ferromagnetic layer 103, an antiparallel coupling layer 104, a second ferromagnetic layer 105, a nonmagnetic interlayer 106, a free magnetic layer (soft magnetic free layer) 107, and a protective layer 108. The first ferromagnetic layer 103 is antiferromagnetically coupled to the second ferromagnetic layer 105 through the antiparallel coupling layer 104, thus forming a ferromagnetic pinned layer of self-pinned type (or synthetic ferri-pinned (SFP) layer).

Referring to FIG. 2, the magnetic sensors 11a and 11b are connected to the arithmetic unit 13a. The arithmetic unit 13a calculates the difference (output difference) between an output of the magnetic sensor 11a and an output of the magnetic sensor 11b. The output difference calculated by the arithmetic unit 13a may be amplified so long as the output difference corresponds to the difference between the outputs of the magnetic sensors 11a and 11b. This arithmetic processing cancels out changes in sensitivity in the outputs of the magnetic sensors 11a and 11b, so that the influence of the external magnetic field Hc oriented parallel to the bias magnetic fields (or the magnetic field oriented perpendicular to the sensing direction) can be reduced.

Figure 5:
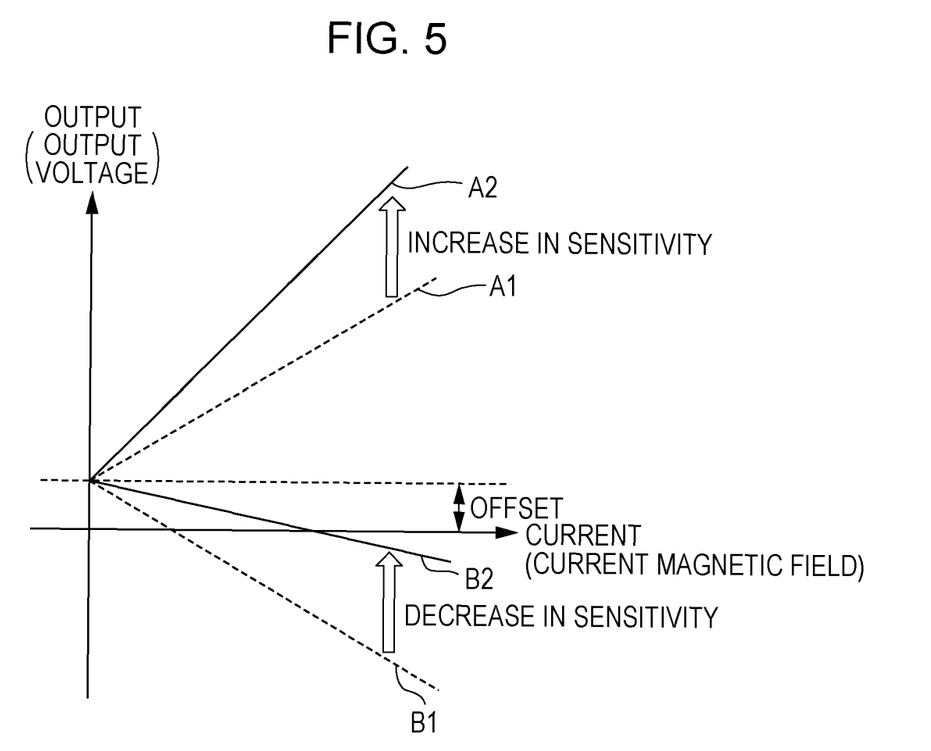
FIG. 5 is a characteristic diagram illustrating output characteristics of magnetic sensors included in the current sensor according to the first embodiment.

FIG. 5 is a characteristic diagram illustrating output characteristics of the magnetic sensors 11a and 11b under no influence of the external magnetic field Hc and output characteristics of the magnetic sensors 11a and 11b under the influence of the external magnetic field Hc. In FIG. 5, the axis of abscissas denotes the target current I and the axis of ordinates denotes the output of each magnetic sensor.

As described above, the sensing direction Sa of the magnetic sensor 11a is the same as (or forward relative to) the direction of the induced magnetic field Ha in the current sensor 1a. Accordingly, as indicated by characteristic A1 in FIG. 5, the output of the magnetic sensor 11a under no influence of the external magnetic field Hc increases as the target current I increases. On the other hand, the sensing direction Sb of the magnetic sensor 11b is opposite to (or backward relative to) the direction of the induced magnetic field Hb. Accordingly, as indicated by characteristic B1 in FIG. 5, the output of the magnetic sensor 11b under no influence of the external magnetic field Hc decreases as the target current I increases. In this case, it is assumed that the magnetic sensors 11a and 11b have substantially the same sensitivity, the relationship between the intensity of the magnetic field and the output of each of the magnetic sensors 11a and 11b is substantially linear, and the absolute value of the inclination of the characteristic A1 is substantially equal to that of the characteristic B1. Furthermore, the output of the magnetic sensor 11a and the output of the magnetic sensor 11b each have a predetermined offset.

When the sensitivity of the magnetic sensor 11a increases, as indicated by characteristic A2, under the influence of the external magnetic field Hc, the sensitivity of the magnetic sensor 11b decreases as indicated by characteristic B2. The reason is that the bias magnetic field in one of the two magnetic sensors is oriented opposite to (or backward relative to) the bias magnetic field in the other magnetic sensor. The output, $O_{11a}$, of the magnetic sensor 11a and the output, $O_{11b}$, of the magnetic sensor 11b are expressed by Equations (1) and (2), respectively, as follows:

$$O_{11a} = (1+\alpha)Oi + \beta \quad (1)$$

$$O_{11b} = -(1-\alpha)Oi + \beta \quad (2)$$

where $\alpha$ denotes the rate of change in sensitivity under the influence of the external magnetic field, $\beta$ denotes the offset, and Oi denotes an output corresponding to the target current under no influence of the external magnetic field.

If the rate ($\alpha$) of change in sensitivity under the influence of the external magnetic field in Equations (1) and (2) is constant, the arithmetic unit 13a obtains the difference between the output $O_{11a}$ of the magnetic sensor 11a and the output $O_{11b}$ of the magnetic sensor 11b, as expressed by Equation (3), to cancel out the influence of the external magnetic field, thus increasing the accuracy of current measurement.

$$O_{11a} - O_{11b} = 2Oi \quad (3)$$

Figure 13:
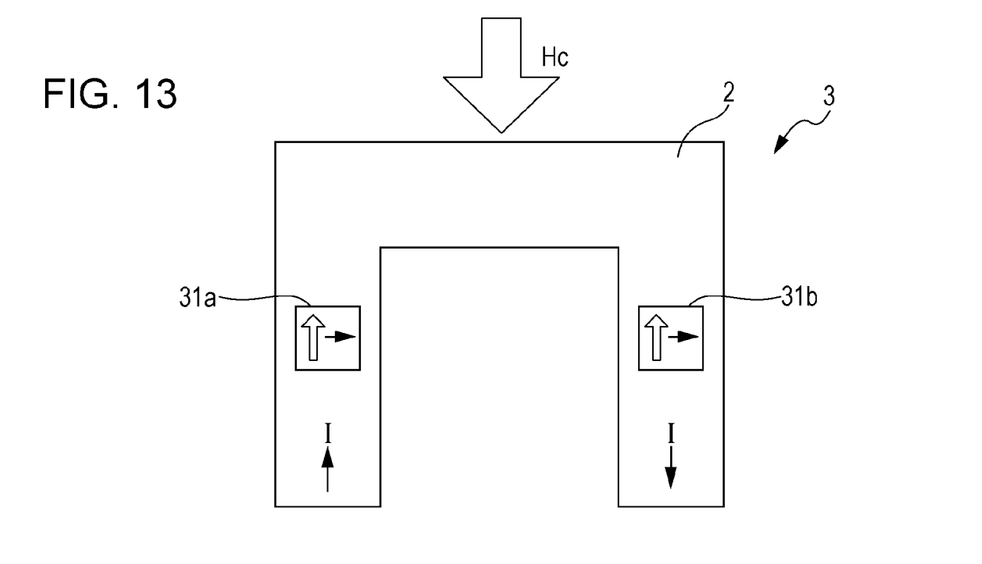
FIG. 13 is a schematic plan view of a related-art current sensor.
Figure 14:
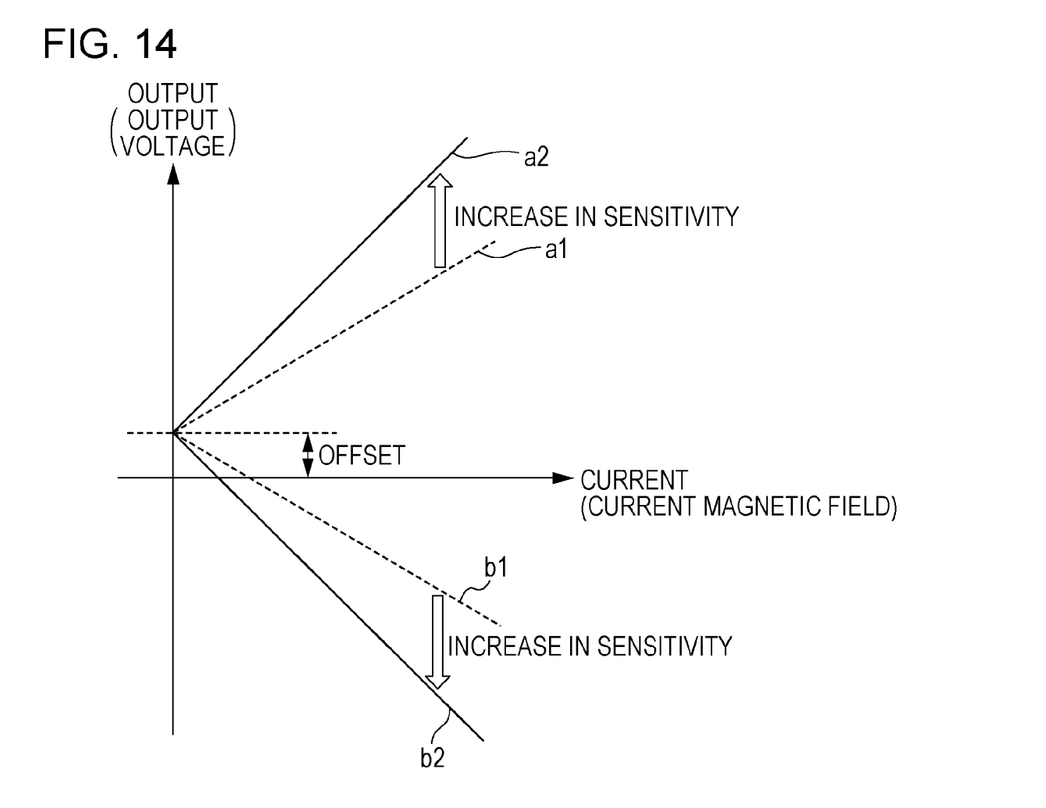
FIG. 14 is a characteristic diagram illustrating output characteristics of magnetic sensors included in the related-art current sensor.

Output characteristics of a related-art current sensor having a configuration different from that of the current sensor 1a according to the first embodiment of the present invention will be described below. FIG. 13 is a schematic plan view illustrating the configuration of the related-art current sensor. FIG. 14 is a characteristic diagram illustrating output characteristics of magnetic sensors included in the related-art current sensor.

As illustrated in FIG. 13, the related-art current sensor, indicated at 3, includes magnetic sensors 31a and 31b arranged in close proximity to the current line 2 through which the target current I flows and an arithmetic unit (not illustrated). The current sensor 3 is configured such that a bias magnetic field in a magnetoresistive element included in the magnetic sensor 31a is oriented in the same direction as a bias magnetic field in a magnetoresistive element included in the magnetic sensor 31b. In other words, the related-art current sensor 3 differs from the current sensor 1a according to the first embodiment in the direction of the bias magnetic field in the magnetic sensor. The other configuration of the related-art magnetic sensor 3 is the same as that of the current sensor 1a.

In the related-art magnetic sensor 3, the bias magnetic field in the magnetoresistive element included in the magnetic sensor 31a is oriented in the same direction as that in the magnetic sensor 31b. Accordingly, when the magnetic sensors 31a and 31b are affected by the external magnetic field Hc, the sensitivities of the magnetic sensors 31a and 31b increase together. Consequently, as illustrated in FIG. 14, the output characteristic of the magnetic sensor 31a changes from characteristic a1 to characteristic a2 and the output characteristic of the magnetic sensor 31b changes from characteristic b1 to characteristic b2. The output, $O_{31a}$, of the magnetic sensor 31a and the output, $O_{31b}$, of the magnetic sensor 31b are expressed by Equations (4) and (5).

$$O_{31a} = (1+\alpha)Oi + \beta \quad (4)$$

$$O_{31b} = -(1+\alpha)Oi + \beta \quad (5)$$

In this case, if the difference between the outputs $O_{31a}$ and $O_{31b}$ of the magnetic sensors 31a and 31b is obtained, the influence ($\alpha$) of the external magnetic field remains as expressed by Equation (6).

$$O_{31a} - O_{31b} = 2(1+\alpha)Oi \quad (6)$$

As described above, the influence of the external magnetic field cannot be removed from an output of the related-art current sensor 3. On the other hand, in the current sensor 1a according to the first embodiment, since the directions of the bias magnetic fields are properly controlled, the influences of the changes in sensitivity are canceled out by the difference between the outputs of the two magnetic sensors, thus suppressing a reduction in current measurement accuracy.

The configuration of the current sensor 1a according to the first embodiment is not limited to the above-described one. For example, a magnetic balance current sensor including a feedback coil may be used as each of the magnetic sensors 11a and 11b of the current sensor 1a. Furthermore, the current sensor 1a does not have to include a control unit and the arithmetic unit. For example, the control unit and the arithmetic unit may be provided outside the current sensor 1a, the control unit may control the current sensor 1*a*, and the arithmetic unit may perform arithmetic processing on the outputs of the magnetic sensors.

Figure 6A:
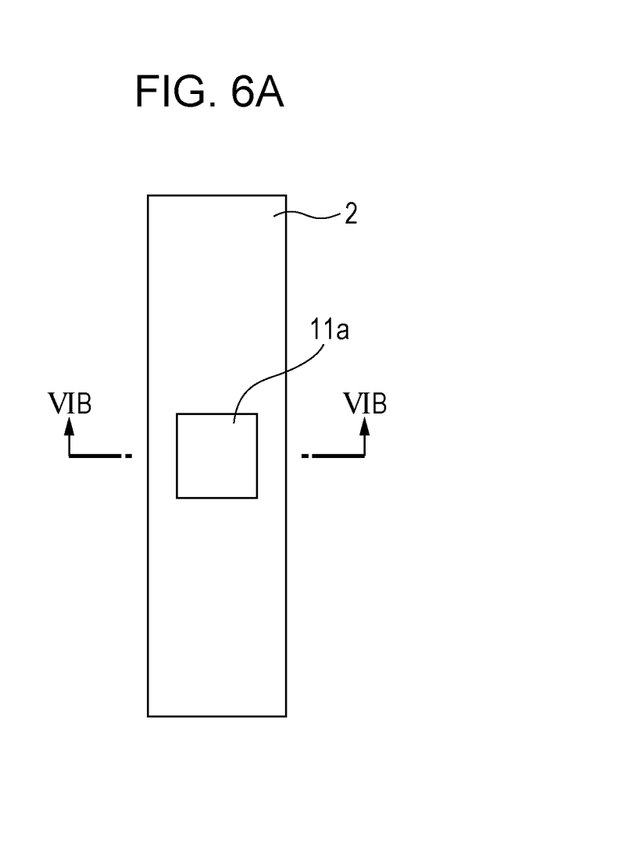
FIGS. 6A and 6B are schematic diagrams illustrating an exemplary placement of the current sensor according to the first embodiment relative to the current line shaped in a different form.
Figure 6B:
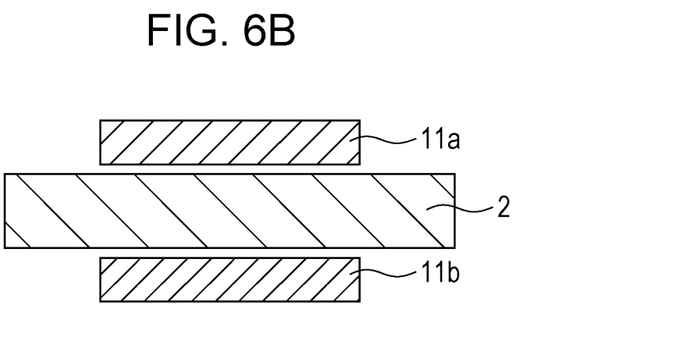

The current line 2 does not have to be U-shaped. FIGS. 6A and 6B are schematic diagrams illustrating an exemplary placement of the current sensor 1*a* relative to the current line 2 shaped in a different form. As illustrated in FIG. 6A, the current line 2 may be substantially linear (I-shaped). In this case, the magnetic sensors 11*a* and 11*b* may be arranged adjacent to a first surface (front surface) and a second surface (rear surface) of the current line 2, respectively, as illustrated in FIG. 6B which is a cross-sectional view taken along the line VIB-VIB in FIG. 6A. In the case where the current line 2 is U-shaped, the induced magnetic field generated by the target current I flowing through the connecting portion 2*c* and oriented parallel to the bias magnetic fields is applied to the magnetic sensors 11*a* and 11*b*. Accordingly, the configuration in the first embodiment is particularly effective in the use of the U-shaped current line 2 because the influence of this induced magnetic field can be reduced.

Additionally, the configuration according to the first embodiment may be appropriately implemented in combination with a configuration according to another embodiment.

Second Embodiment

Figure 7:
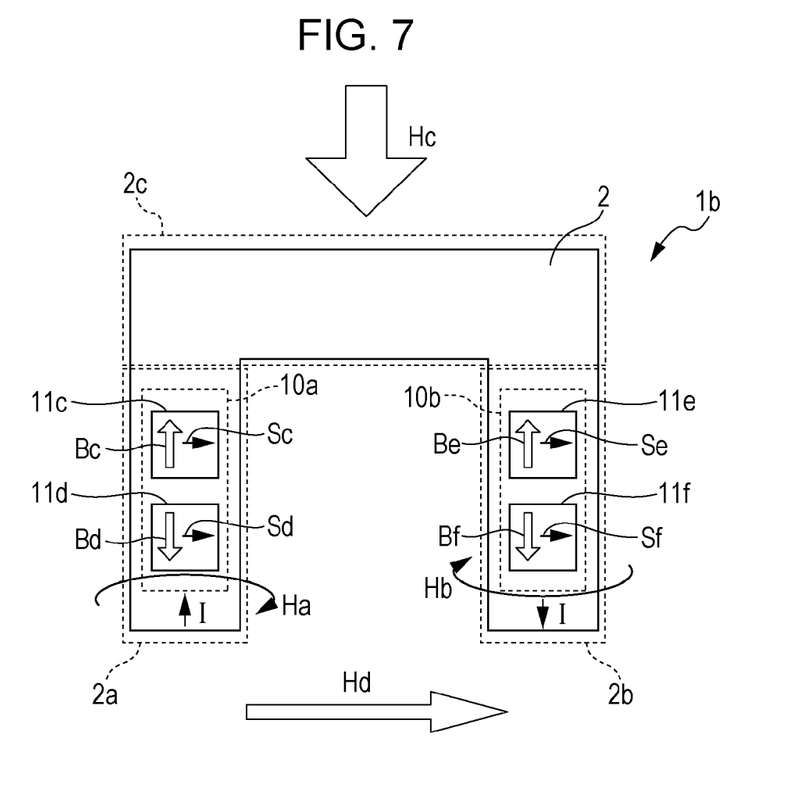
FIG. 7 is a schematic plan view of an exemplary arrangement of a current sensor according to a second embodiment and its surroundings.
Figure 8:
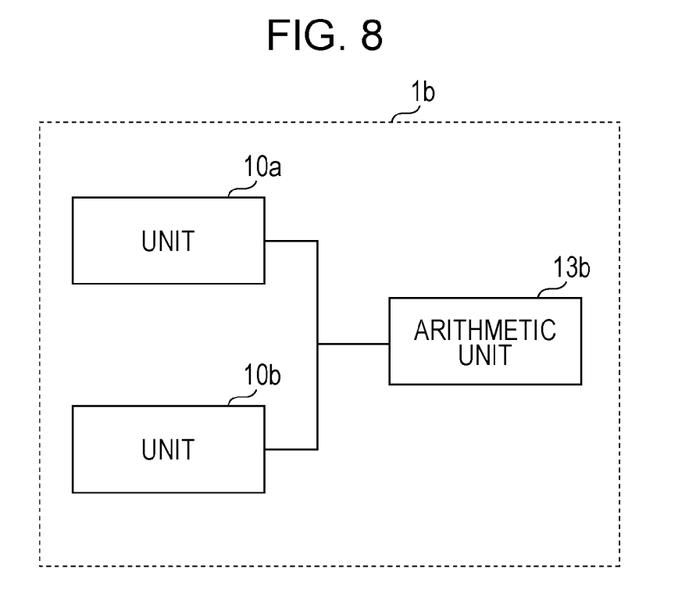
FIG. 8 is a block diagram illustrating a circuit configuration of the current sensor according to the second embodiment.

A second embodiment will be described with respect to a current sensor having a different configuration from that of the above-described current sensor according to the first embodiment. FIG. 7 is a schematic plan view of an exemplary arrangement of a current sensor according to the second embodiment and its surroundings. FIG. 8 is a block diagram illustrating a circuit configuration of the current sensor according to this embodiment. As illustrated in FIGS. 7 and 8, the current sensor, indicated at 1*b*, according to the second embodiment includes units 10*a* and 10*b* arranged in close proximity to the current line 2 and an arithmetic unit 13*b* to perform arithmetic processing on outputs of the units. The unit 10*a* includes magnetic sensors 11*c* and 11*d* and the unit 10*b* includes magnetic sensors 11*e* and 11*f*.

The magnetic sensors 11*c* and 11*d* are arranged in close proximity to the arm 2*a* of the current line 2 and are capable of detecting the induced magnetic field Ha from the target current I flowing through the arm 2*a*. The magnetic sensors 11*e* and 11*f* are arranged in close proximity to the arm 2*b* of the current line 2 and are capable of detecting the induced magnetic field Hb from the target current I flowing through the arm 2*b*. The magnetic sensors 11*c* to 11*f* are arranged on a substrate (not illustrated).

The magnetic sensors 11*c* and 11*d* constituting the unit 10*a* are arranged such that sensing directions Sc and Sd (along the sensing axes) of the magnetic sensors 11*c* and 11*d* are rightward in FIG. 7. The target current I flows through the arm 2*a* of the current line 2 so as to generate the induced magnetic field Ha oriented to the right in FIG. 7 in the vicinity of the magnetic sensors 11*c* and 11*d*. In other words, the sensing directions Sc and Sd of the magnetic sensors 11*c* and 11*d* are the same as (or forward relative to) the direction of the induced magnetic field Ha in the current sensor 1*b* of FIG. 7. The direction of the induced magnetic field Ha applied to the magnetic sensors 11*c* and 11*d* is the same as the sensing directions Sc and Sd.

The magnetic sensors 11*e* and 11*f* constituting the unit 10*b* are arranged such that sensing directions Se and Sf (along the sensing axes) of the magnetic sensors 11*e* and 11*f* are rightward in FIG. 7. The target current I flows through the arm 2*b* of the current line 2 so as to generate the induced magnetic field Hb oriented to the left in FIG. 7 in the vicinity of the magnetic sensors 11*e* and 11*f*. In other words, the sensing directions Se and Sf of the magnetic sensors 11*e* and 11*f* are opposite to (or backward relative to) the direction of the induced magnetic field Hb in the current sensor 1*b* of FIG. 7. The direction of the induced magnetic field Hb applied to the magnetic sensors 11*e* and 11*f* is opposite to the sensing directions Se and Sf.

The magnetic sensor 11*c* is disposed such that a bias magnetic field Bc is oriented upward in FIG. 7. The magnetic sensor 11*d* is disposed such that a bias magnetic field Bd is oriented downward in FIG. 7. Specifically, the unit 10*a* of the current sensor 1*b* is configured such that the direction of the bias magnetic field Bc in a magnetoresistive element included in the magnetic sensor 11*c* is opposite to (backward relative to) the direction of the bias magnetic field Bd in a magnetoresistive element included in the magnetic sensor 11*d*.

Similarly, the magnetic sensor 11*e* is disposed such that a bias magnetic field Be is oriented upward in FIG. 7. The magnetic sensor 11*f* is disposed such that a bias magnetic field Bf is oriented downward in FIG. 7. Specifically, the unit 10*b* of the current sensor 1*b* is configured such that the direction of the bias magnetic field Be in a magnetoresistive element included in the magnetic sensor 11*e* is opposite to (or backward relative to) the direction of the bias magnetic field Bf in a magnetoresistive element included in the magnetic sensor 11*f*.

The circuit configuration of each unit is the same as that of the current sensor 1*a* according to the first embodiment (refer to FIG. 2). Specifically, the current sensor 1*b* according to the second embodiment includes the two units 10*a* and 10*b* each including components equivalent to the magnetic sensors 11*a* and 11*b* and the arithmetic unit 13*a* of the current sensor 1*a*. An arithmetic section (corresponding to the arithmetic unit 13*a*) included in each unit is configured to calculate the sum (output sum) of outputs of the magnetic sensors in the unit. Specifically, the arithmetic section of the unit 10*a* is capable of calculating the sum of the outputs of the magnetic sensors 11*c* and 11*d* and the arithmetic section of the unit 10*b* is capable of calculating the sum of the outputs of the magnetic sensors 11*e* and 11*f*. The output sum calculated by such an arithmetic section may be amplified so long as the output sum corresponds to the sum of the outputs of the magnetic sensors.

Referring to FIG. 8, the units 10*a* and 10*b* of the current sensor 1*b* are connected to the arithmetic unit 13*b*. The arithmetic unit 13*b* is configured to calculate the difference between outputs from the units. Specifically, the arithmetic unit 13*b* calculates the difference between the output from the arithmetic section of the unit 10*a* and the output from the arithmetic section of the unit 10*b*.

Figure 9:
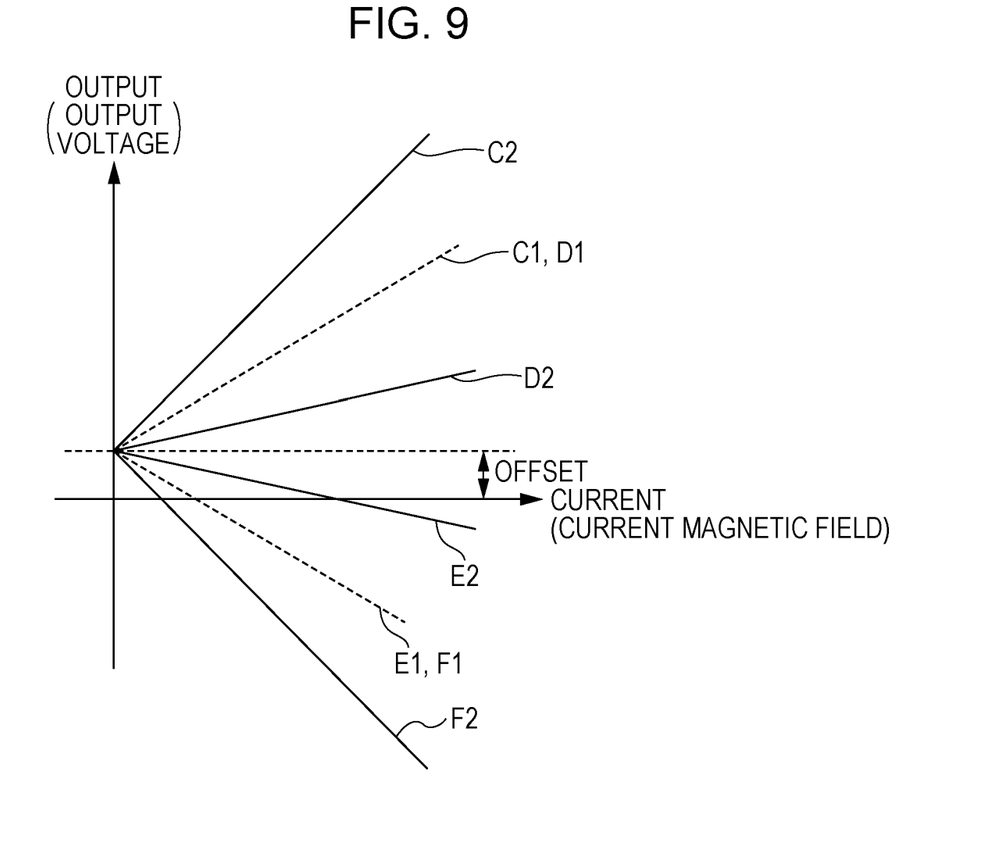
FIG. 9 is a characteristic diagram illustrating output characteristics of magnetic sensors included in the current sensor according to the second embodiment.

FIG. 9 is a characteristic diagram illustrating output characteristics of the magnetic sensors in the current sensor according to the second embodiment. As described above, the direction of the bias magnetic field Bc in the magnetoresistive element included in the magnetic sensor 11*c* is opposite to (or backward relative to) the direction of the bias magnetic field Bd in the magnetoresistive element included in the magnetic sensor 11*d* in the unit 10*a*. Accordingly, when the magnetic sensors 11*c* and 11*d* are affected by the external magnetic field Hc, the sensitivity of the magnetic sensor 11*c* increases, or changes from characteristic C1 to characteristic C2 and the sensitivity of the magnetic sensor 11*d* decreases, or changes from characteristic D1 (=the characteristic C1) to characteristic D2. Similarly, when the magnetic sensors 11*e* and 11*f* are affected by the external magnetic field Hc, the sensitivity of the magnetic sensor 11*e* increases, or changes from characteristic E1 to characteristic E2 and the sensitivity of the magnetic sensor 11f decreases, or changes from characteristic F1 (=the characteristic E1) to characteristic F2.

The output, $O_{11c}$, of the magnetic sensor 11c, the output, $O_{11d}$, of the magnetic sensor 11d, the output, $O_{11e}$, of the magnetic sensor 11e, and the output, $O_{11f}$, of the magnetic sensor 11f are expressed by Equations (7) to (10), respectively, as follows:

$$O_{11c}=(1+\alpha)(Oi+On)+\beta \quad (7)$$

$$O_{11d}=(1-\alpha)(Oi+On)+\beta \quad (8)$$

$$O_{11e}=(1+\alpha)(-Oi+On)+\beta \quad (9)$$

$$O_{11f}=(1-\alpha)(-Oi+On)+\beta \quad (10)$$

where α denotes the rate of change in sensitivity under the influence of the external magnetic field, β denotes the offset, Oi denotes the output corresponding to the target current under no influence of the external magnetic field, and On denotes a change in output of the magnetic sensor caused by an external magnetic field Hd, which is oriented in the sensing direction as illustrated in FIG. 7.

Assuming that the rate (α) of change in sensitivity under the influence of the external magnetic field Hc is constant, the arithmetic section of the unit 10a calculates the sum of the outputs $O_{11c}$ and $O_{11d}$ of the magnetic sensors 11c and 11d, thus canceling out the influence of the external magnetic field Hc as expressed by Equation (11).

$$O_{11c}+O_{11d}=2(Oi+On)+2\beta \quad (11)$$

In addition, the arithmetic section of the unit 10b calculates the sum of the outputs $O_{11c}$ and $O_{11f}$ of the magnetic sensors 11e and 11f, thus canceling out the influence of the external magnetic field Hc as expressed by Equation (12).

$$O_{11e}+O_{11f}=2(-Oi+On)+2\beta \quad (12)$$

Furthermore, the arithmetic unit 13b calculates the difference between the outputs of the units 10a and 10b, thus canceling out the influences of the external magnetic field Hd and the offset β as expressed by Equation (13).

$$(O_{11c}+O_{11d})-(O_{11c}+O_{11f})=4Oi \quad (13)$$

As described above, since the directions of the bias magnetic fields are properly controlled in the current sensor 1b according to the second embodiment, the influences of the changes in sensitivity of the magnetic sensors can be canceled out. In addition, since the current sensor 1b includes the two units, the influence of the external magnetic field Hd applied in the sensing direction can also be sufficiently reduced. Thus, a reduction in current measurement accuracy can be further suppressed.

Figure 10A:
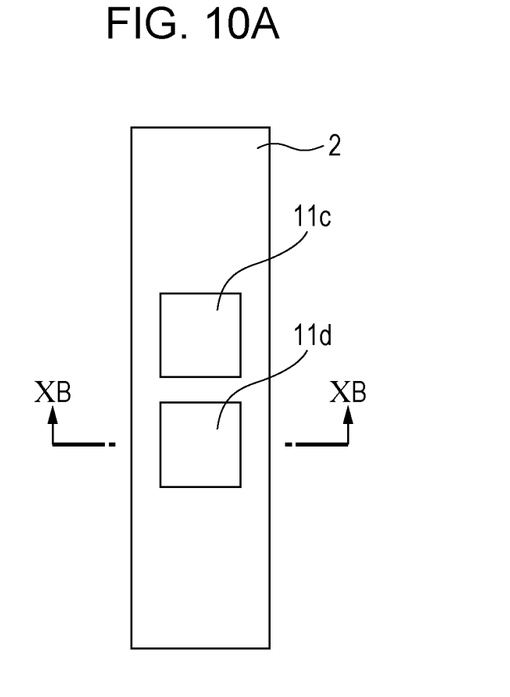
FIGS. 10A and 10B are schematic diagrams illustrating an exemplary placement of the current sensor according to the second embodiment relative to the current line shaped in a different form.
Figure 10B:
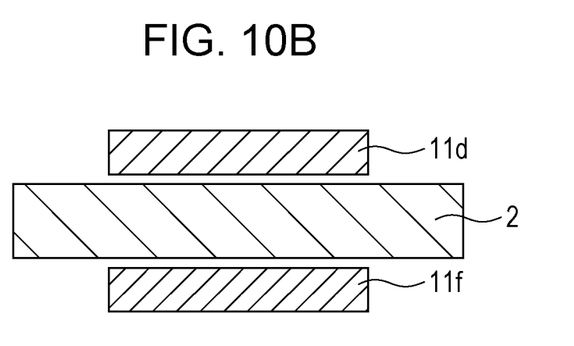

The configuration of the current sensor 1b according to the second embodiment is not limited to the above-described one. For example, the current sensor 1b may include a single arithmetic unit that achieves the function (for calculating the sum of outputs of the magnetic sensors) of the arithmetic section of each unit and the function (for calculating the difference between outputs of the units) of the arithmetic unit 13b. Furthermore, the arithmetic unit may be provided outside the current sensor 1b. Additionally, the current line 2 does not have to be U-shaped. For example, the current line 2 may be substantially linear (I-shaped) as illustrated in FIG. 10A. In this case, as illustrated in FIG. 10B which is a cross-sectional view taken along the line XB-XB in FIG. 10A, the magnetic sensor 11c (not illustrated in FIG. 10B) and the magnetic sensor 11d may be arranged adjacent to the first surface (front surface) of the current line 2 and the magnetic sensor 11e (not illustrated in FIG. 10B) and the magnetic sensor 11f may be arranged adjacent to the second surface (rear surface) of the current line 2.

In the current sensor 1b according to the second embodiment, the magnetic sensors 11c and 11d constituting the unit 10a may be accommodated in a package and the magnetic sensors 11e and 11f constituting the unit 10b may be accommodated in another package. Consequently, a measurement error caused by the difference between measurement positions can be reduced by providing each unit as a single package. Thus, the current measurement accuracy can be further increased. In terms of space saving, ease of handing, or the like, it is preferred to provide each unit as a single package.

Furthermore, the configuration according to the second embodiment may be appropriately implemented in combination with a configuration according to another embodiment.

Third Embodiment

Figure 11:
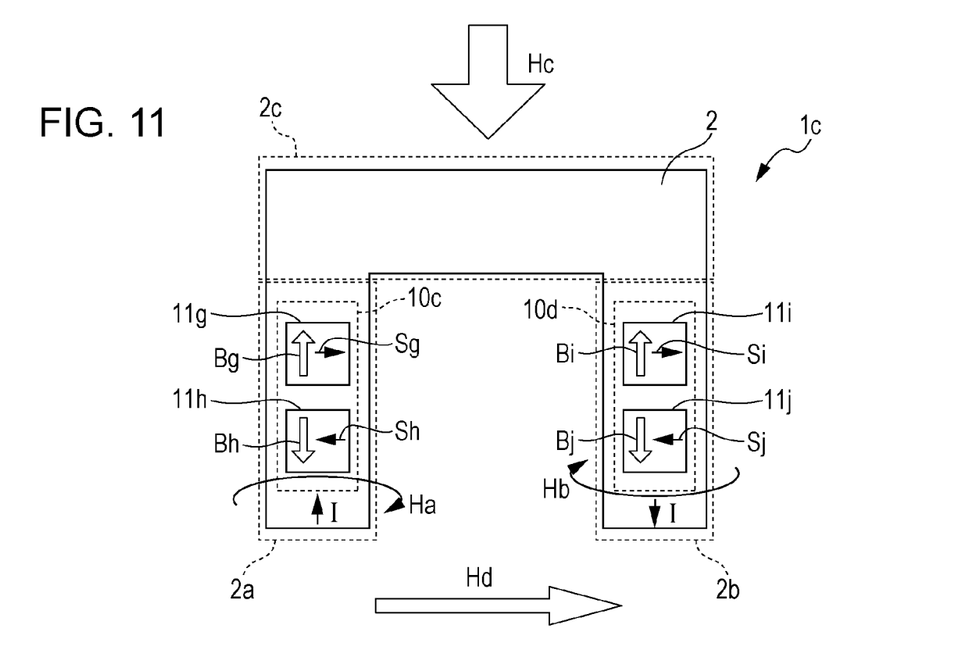
FIG. 11 is a schematic plan view of an exemplary arrangement of a current sensor according to a third embodiment and its surroundings.

A third embodiment will be described with respect to a current sensor having a different configuration from those of the above-described current sensors according to the first and second embodiments. FIG. 11 is a schematic plan view of an exemplary arrangement of a current sensor according to the third embodiment and its surroundings. As illustrated in FIG. 11, the current sensor, indicated at 1c, according to the third embodiment includes units 10c and 10d arranged in close proximity to the current line 2. The unit 10c includes magnetic sensors 11g and 11h and the unit 10d includes magnetic sensors 11i and 11j. The current sensor 1c is configured such that outputs of the units are subjected to arithmetic processing by an arithmetic unit (not illustrated).

The magnetic sensors 11g and 11h are arranged in close proximity to the arm 2a of the current line 2 and are capable of detecting the induced magnetic field Ha from the target current I flowing through the arm 2a. The magnetic sensors 11i and 11j are arranged in close proximity to the arm 2b of the current line 2 and are capable of detecting the induced magnetic field Hb from the target current I flowing through the arm 2b. The magnetic sensors 11g to 11j are arranged on a substrate (not illustrated).

The magnetic sensor 11g included in the unit 10c is disposed such that a sensing direction Sg (along the sensing axis) of the magnetic sensor 11g is rightward in FIG. 11. On the other hand, the magnetic sensor 11h is disposed such that a sensing direction Sh (along the sensing axis) of the magnetic sensor 11h is leftward in FIG. 11. The target current I flows through the arm 2a of the current line 2 so as to generate the induced magnetic field Ha oriented to the right in FIG. 11 in the vicinity of the magnetic sensors 11g and 11h. In other words, the sensing direction Sg of the magnetic sensor 11g is the same as (or forward relative to) the direction of the induced magnetic field Ha in the current sensor 1c of FIG. 11. In addition, the sensing direction Sh of the magnetic sensor 11h is opposite to (or backward relative to) the direction of the induced magnetic field Ha. The direction of the induced magnetic field Ha applied to the magnetic sensor 11g with reference to the sensing direction Sg is opposite to that applied to the magnetic sensor 11d with reference to the sensing direction Sh.

The magnetic sensor 11i included in the unit 10d is disposed such that a sensing direction Si (along the sensing axis) of the magnetic sensor 11i is rightward in FIG. 11. On the other hand, the magnetic sensor 11j is disposed such that a sensing direction Sj (along the sensing axis) of the magnetic sensor 11j is leftward in FIG. 11. The target current I flows through the arm 2b of the current line 2 so as to generate the induced magnetic field Hb oriented to the left in FIG. 11 in the vicinity of the magnetic sensors 11*i* and 11*j*. In other words, the sensing direction Si of the magnetic sensor 11*i* is opposite to (or backward relative to) the direction of the induced magnetic field Hb in the current sensor 1*c* of FIG. 11. In addition, the sensing direction Sj of the magnetic sensor 11*j* is the same as (or forward relative to) the direction of the induced magnetic field Hb. The direction of the induced magnetic field Hb applied to the magnetic sensor 11*i* with reference to the sensing direction Si is opposite to that applied to the magnetic sensor 11*j* with reference to the sensing direction Sj.

The magnetic sensor 11*g* is disposed such that a bias magnetic field Bg is oriented upward in FIG. 11. The magnetic sensor 11*h* is disposed such that a bias magnetic field Bh is oriented downward in FIG. 11. Specifically, the unit 10*c* of the current sensor 1*c* is configured such that the direction of the bias magnetic field Bg in a magnetoresistive element included in the magnetic sensor 11*g* is opposite to (or backward relative to) the direction of the bias magnetic field Bh in a magnetoresistive element included in the magnetic sensor 11*h*.

Similarly, the magnetic sensor 11*i* is disposed such that a bias magnetic field Bi is oriented upward in FIG. 11. The magnetic sensor 11*j* is disposed such that a bias magnetic field Bj is oriented downward in FIG. 11. Specifically, the unit 10*d* of the current sensor 1*c* is configured such that the direction of the bias magnetic field Bi in a magnetoresistive element included in the magnetic sensor 11*i* is opposite to (or backward relative to) the direction of the bias magnetic field Bj in a magnetoresistive element included in the magnetic sensor 11*j*.

The circuit configuration of each unit is the same as that of the current sensor 1*a* according to the first embodiment (refer to FIG. 2). Specifically, the current sensor 1*c* according to the third embodiment includes the two units 10*c* and 10*d* each including components equivalent to the magnetic sensors 11*a* and 11*b* and the arithmetic unit 13*a* of the current sensor 1*a*. An arithmetic section (corresponding to the arithmetic unit 13*a*) included in each unit is configured to calculate the difference (output difference) between outputs of the magnetic sensors in the unit.

The connection relationship between the units and the arithmetic unit is the same as that in the above-described current sensor 1*b* according to the second embodiment (refer to FIG. 8). Specifically, the units 10*c* and 10*d* are connected to the arithmetic unit capable of calculating the difference between outputs of the units.

Figure 12:
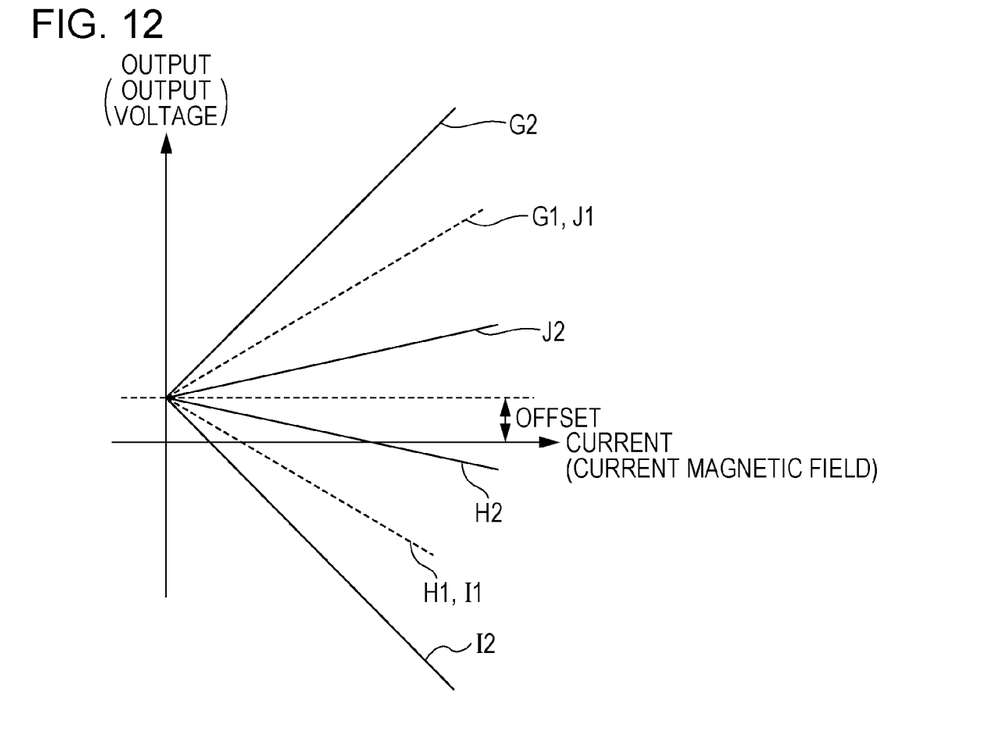
FIG. 12 is a characteristic diagram illustrating output characteristics of magnetic sensors included in the current sensor according to the third embodiment.

FIG. 12 is a characteristic diagram illustrating output characteristics of the magnetic sensors in the current sensor according to the third embodiment. As described above, the direction of the bias magnetic field Bg in the magnetoresistive element included in the magnetic sensor 11*g* is opposite to (or backward relative to) the direction of the bias magnetic field Bh in the magnetoresistive element included in the magnetic sensor 11*h* in the unit 10*c*. Accordingly, when the magnetic sensors 11*g* and 11*h* are affected by the external magnetic field Hc, the sensitivity of the magnetic sensor 11*g* increases, or changes from characteristic G1 to characteristic G2 and the sensitivity of the magnetic sensor 11*h* decreases, or changes from characteristic H1 to characteristic H2. Similarly, when the magnetic sensors 11*i* and 11*j* are affected by the external magnetic field Hc, the sensitivity of the magnetic sensor 11*i* increases, or changes from characteristic I1 to characteristic I2 and the sensitivity of the magnetic sensor 11*j* decreases, or changes from characteristic J1 to characteristic J2.

The output, $O_{11g}$, of the magnetic sensor 11*g*, the output, $O_{11h}$, of the magnetic sensor 11*h*, the output, $O_{11i}$, of the magnetic sensor 11*i*, and the output, $O_{11j}$, of the magnetic sensor 11*j* are expressed by Equations (14) to (17), respectively, as follows:

$$O_{11g}=(1+\alpha)(Oi+On)+\beta \tag{14}$$

$$O_{11h}=(1-\alpha)(-Oi-On)+\beta \tag{15}$$

$$O_{11i}=(1+\alpha)(-Oi+On)+\beta \tag{16}$$

$$O_{11j}=(1-\alpha)(+Oi-On)+\beta \tag{17}$$

where $\alpha$ denotes the rate of change in sensitivity under the influence of the external magnetic field, $\beta$ denotes the offset, Oi denotes the output corresponding to the target current under no influence of the external magnetic field, and On denotes the change in output of the magnetic sensor caused by the external magnetic field Hd, which is oriented in the sensing direction as illustrated in FIG. 11.

Assuming that the rate ($\alpha$) of change in sensitivity under the influence of the external magnetic field Hc is constant, the arithmetic section of the unit 10*c* calculates the difference between the outputs $O_{11g}$ and $O_{11h}$ of the magnetic sensors 11*g* and 11*h*, thus canceling out the influences of the external magnetic field Hc and the offset $\beta$ as expressed by Equation (18).

$$O_{11g}-O_{11h}=2(Oi+On) \tag{18}$$

In addition, the arithmetic section of the unit 10*d* calculates the difference between the outputs $O_{11i}$ and $O_{11j}$ of the magnetic sensors 11*i* and 11*j*, thus canceling out the influences of the external magnetic field Hc and the offset $\beta$ as expressed by Equation (19).

$$O_{11i}-O_{11j}=2(-Oi+On) \tag{19}$$

Furthermore, the arithmetic unit following the units 10*c* and 10*d* calculates the difference between the outputs of the units 10*c* and 10*d*, thus canceling out the influence of the external magnetic field Hd as expressed by Equation (20).

$$(O_{11g}-O_{11h})-(O_{11i}-O_{11j})=4Oi \tag{20}$$

As described above, since the directions of the bias magnetic fields are properly controlled in the current sensor 1*c* according to the third embodiment, the influences of the changes in sensitivity of the magnetic sensors can be canceled out. In addition, since the current sensor 1*c* includes the two units, the influence of the external magnetic field Hd applied in the sensing direction can also be sufficiently reduced. Thus, a reduction in current measurement accuracy can be further suppressed.

The configuration of the current sensor 1*c* according to the third embodiment is not limited to the above-described one. For example, the current sensor 1*c* may include a single arithmetic unit that achieves the function (for calculating the difference between outputs of the magnetic sensors) of the arithmetic section of each unit and the function (for calculating the difference between outputs of the units) of the arithmetic unit following the units 10*c* and 10*d*. Furthermore, the arithmetic unit may be provided outside the current sensor 1*c*. Additionally, the current line 2 does not have to be U-shaped. For example, the current line 2 may be substantially linear (I-shaped) (refer to FIG. 10A).

In the current sensor 1*c* according to the third embodiment, the magnetic sensors 11*g* and 11*h* constituting the unit 10*c* may be accommodated in a package and the magnetic sensors 11*i* and 11*j* constituting the unit 10*d* may be accommodated in another package. Consequently, a measurement error caused by the difference between measurement positions can be reduced by providing each unit as a single package. Thus, the current measurement accuracy can be further increased. In terms of space saving, ease of handing, or the like, it is preferred to provide each unit as a single package.

Furthermore, the configuration according to the third embodiment may be appropriately implemented in combination with the configurations according to the other embodiments.

As described above, since the current sensor according to each of the embodiments of the present invention is configured such that the bias magnetic fields in the two corresponding magnetoresistive elements are oriented opposite to each other, a reduction in current measurement accuracy can be suppressed if an external magnetic field is applied in a direction parallel to the bias magnetic fields.

The connection relationship between elements and the size of each element in the above-described embodiments may be appropriately changed without departing from the spirit of the invention. In addition, the configurations, methods, and the like described in the foregoing embodiments may be combined and implemented as appropriate. Furthermore, the present invention may be appropriately modified and implemented within the scope of the present invention.

INDUSTRIAL APPLICABILITY

The current sensor according to any of the embodiments of the present invention can be used to detect the magnitude of current for driving a motor of an electric-powered vehicle, a hybrid car, or the like.

What is claimed is:

1. A current sensor comprising:
first, second, third, and fourth magnetoresistive elements configured to detect an induced magnetic field from a target current to be measured and output first, second, third, and fourth outputs, respectively, the target current flowing through a current path, the first, second, third, and fourth magnetoresistive elements having first, second, third, and fourth sensing axes, respectively; and
an arithmetic unit configured to process the first, second, third, and fourth outputs,
wherein each of the first, second, third, and fourth magnetoresistive elements includes a free magnetic layer and a hard bias layer applying a bias magnetic field to the free magnetic layer,
wherein the first, second, third, and fourth magnetoresistive elements are arranged such that:
the bias magnetic field in the first magnetoresistive element is oriented opposite to the bias magnetic field in the second magnetoresistive element,
the bias magnetic field in the third magnetoresistive element is oriented opposite to the bias magnetic field in the fourth magnetoresistive element,
the bias magnetic field in the first magnetoresistive element and the bias magnetic field in the third magnetoresistive element are oriented in a same direction, and
the bias magnetic field in the second magnetoresistive element and the bias magnetic field in the fourth magnetoresistive element are oriented in a same direction,
wherein the induced magnetic field applied to the first and second magnetoresistive elements has a first direction, and the induced magnetic field applied to the third and fourth magnetoresistive elements has a second direction opposite to the first direction,
wherein the first, second, third, and fourth sensing axes are oriented in a same direction,
and wherein the arithmetic unit subtracts a sum of the third and fourth outputs from a sum of the first and second outputs.

2. The current sensor according to claim 1,
wherein the current path extends linearly,
and wherein the first and second magnetoresistive elements are disposed on a first side of the current path, while the third and fourth magnetoresistive elements are disposed on a second side of the current path opposite the first side with respect to the current path.

3. A current sensor comprising:
first, second, third, and fourth magnetoresistive elements configured to detect an induced magnetic field from a target current to be measured and output first, second, third, and fourth outputs, respectively, the target current flowing through a current path, the first, second, third, and fourth magnetoresistive elements having first, second, third, and fourth sensing axes, respectively; and
an arithmetic unit configured to process the first, second, third, and fourth outputs,
wherein each of the first, second, third, and fourth magnetoresistive elements includes a free magnetic layer and a hard bias layer applying a bias magnetic field to the free magnetic layer,
wherein the first, second, third, and fourth magnetoresistive elements are arranged such that:
the bias magnetic field in the first magnetoresistive element is oriented opposite to the bias magnetic field in the second magnetoresistive element,
the bias magnetic field in the third magnetoresistive element is oriented opposite to the bias magnetic field in the fourth magnetoresistive element,
the bias magnetic field in the first magnetoresistive element and the bias magnetic field in the third magnetoresistive element are oriented in a same direction, and
the bias magnetic field in the second magnetoresistive element and the bias magnetic field in the fourth magnetoresistive element are oriented in a same direction,
wherein the induced magnetic field applied to the first and second magnetoresistive elements has a first direction, and the induced magnetic field applied to the third and fourth magnetoresistive elements has a second direction opposite to the first direction,
wherein the first and third sensing axes are oriented in a third direction, and the second and fourth sensing axes are oriented in a fourth direction opposite to the third direction
and wherein the arithmetic unit subtracts a difference between the third and fourth outputs from a difference between the first and second outputs.

4. The current sensor according to claim 3,
wherein the current path includes a first portion and a second portion parallel to each other and a third portion connecting the first and second portions, the third portion being perpendicular to the first and second portions, and
wherein the first, second, third, and fourth magnetoresistive elements are disposed on a same side of the current path such that the first and second magnetoresistive elements detect the induced magnetic field from the target current flowing through the first portion, and the third and fourth magnetoresistive elements detect the induced magnetic field from the target current flowing through the second portion.

* * * * *